(12) United States Patent
Gianrossi et al.

(10) Patent No.: US 10,044,140 B1
(45) Date of Patent: Aug. 7, 2018

(54) PHYSICAL CABLE SEATING CONFIRMATION FOR NETWORK CABLES

(71) Applicant: Amazon Technologies, Inc., Seattle, WA (US)

(72) Inventors: Paolo Gianrossi, Dublin (IE); Kevin Patrick Windsor, Leesburg, VA (US)

(73) Assignee: Amazon Technologies, Inc., Seattle, WA (US)

( * ) Notice: Subject to any disclaimer, the term of this patent is extended or adjusted under 35 U.S.C. 154(b) by 16 days.

(21) Appl. No.: 14/981,712

(22) Filed: Dec. 28, 2015

(51) Int. Cl.
*H01R 13/633* (2006.01)
*H05K 7/14* (2006.01)

(52) U.S. Cl.
CPC ....... H01R 13/6335 (2013.01); H05K 7/1498 (2013.01)

(58) Field of Classification Search
CPC . H01R 13/6335; H01R 13/641; H05K 7/1498
USPC .......................... 439/345, 354, 488, 489, 478
See application file for complete search history.

(56) References Cited

U.S. PATENT DOCUMENTS

| | | | | |
|---|---|---|---|---|
| 4,486,065 A * | 12/1984 | Wittes | ................ | H01R 13/5812 439/450 |
| 5,120,255 A * | 6/1992 | Kouda | ................ | H01R 13/641 439/489 |
| 6,824,416 B2 * | 11/2004 | Di Mascio | ........... | G02B 6/4292 439/160 |
| 7,934,959 B2 * | 5/2011 | Rephaeli | .............. | G02B 6/4201 439/620.22 |
| 8,616,914 B2 * | 12/2013 | Mumper | ............ | H01R 13/6272 439/489 |
| 9,054,478 B2 * | 6/2015 | Golko | .................... | H01R 43/20 |
| 9,093,774 B2 * | 7/2015 | Chang | .................. | H01R 13/465 |
| 9,281,619 B2 * | 3/2016 | Morello | ............... | H01R 13/639 |
| 2011/0123157 A1 * | 5/2011 | Belsan | ................. | G02B 6/3816 385/75 |
| 2014/0213090 A1 * | 7/2014 | Todd, II | ................. | G01R 11/04 439/301 |

* cited by examiner

*Primary Examiner* — Tulsidas C Patel
*Assistant Examiner* — Travis Chambers
(74) *Attorney, Agent, or Firm* — Kilpatrick Townsend & Stockton LLP

(57) ABSTRACT

Cabling arrangements or associated components can be provided that use plugs and sockets for connection. A locking mechanism can secure a plug in a seated configuration in a socket. A handle may be operable to disengage the locking mechanism, for example, to facilitate removal of the plug from the socket. A tab can be provided that is configured for detachably coupling with the handle. The tab can be configured to detach from the handle in response to a detachment force exerted on the tab that is less than a disengagement force that is sufficient when exerted on the handle to disengage the locking mechanism.

20 Claims, 1 Drawing Sheet

PHYSICAL CABLE SEATING CONFIRMATION FOR NETWORK CABLES

BACKGROUND

Datacenters house collections of servers and networking hardware, including switches and routers. Often many different cabled connections between components are used to connect the components, for example, to permit data transfer between the components. The number of connections for any given component can quickly become nontrivial as one component may connect to tens or hundreds of other components through such cabled connections. If any of these many connections are inadequate (e.g., if a cable is incompletely engaged or missed altogether), functionality of components within a server cluster may be negatively impacted, for example, causing reduction in network capacity, speed, or reliability, or, in some cases, even preventing the components from functioning as a network at all.

Typically, operators check the cable seating of connections by hand. Accordingly, verifying that cable connections have been made by properly seating cables in respective sockets can be a significantly time-consuming, repetitive, complicated, and error-prone task. This may especially be the case when initially connecting many components together and managing the great number of connections to be made during a set-up process. With the sheer number of connections in such setup operations or during validation operations, operators can often lose their place in checking connections of cables, which may exacerbate existing problems or result in new ones.

BRIEF DESCRIPTION OF THE DRAWINGS

Various embodiments in accordance with the present disclosure will be described with reference to the drawings, in which.

DETAILED DESCRIPTION

Figure 1:
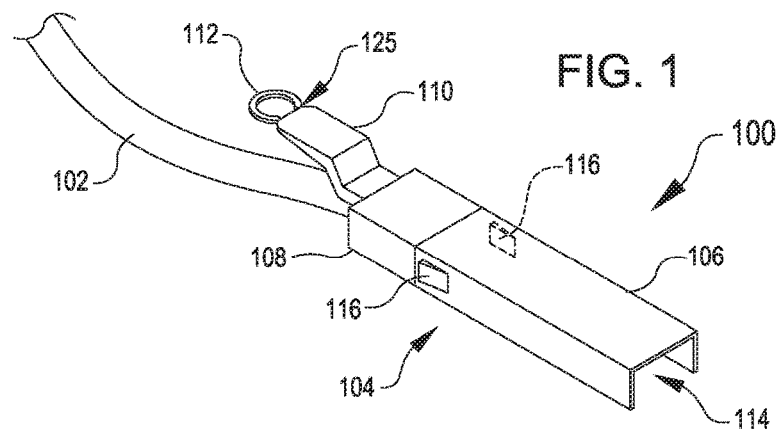
FIG. 1 is a perspective view of a portion of a cabling product according to certain embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to cabling arrangements and components thereof. The cabling arrangements can include indicators that can be used to determine or verify whether cabling connections have been properly made. The indicators may be physical components, such as pieces that are removable or detachable as a result of operations within a process for validating or establishing the connections. In this way, the presence of the indicator may indicate that a cabling connection has not yet been tested or verified, and/or the absence of the indicator may indicate that the cabling connection has been verified as properly established.

In one example embodiment, a cabling arrangement includes cables that connect various appliances, such as computer servers or network hardware components of a data center. Plugs of the cables (e.g., located at ends of the cables) engage sockets of the appliances. When a plug is fully seated or otherwise properly engaged relative to a socket, data and/or power can travel into and/or out of the appliance via the socket, plug, and cable. Locking mechanisms, such as spring-loaded or resilient pins or flanges, can operate to secure the plugs in the fully seated state. Handles (or other disengagement mechanisms) associated with the plugs can be operated to release the locking mechanisms, such as to allow the plugs to be pulled out of (or away from) the socket, e.g., in response to a disengagement force exerted on the handle. A tab, flap, or other indicator can be included that is detachable from the handle or other component associated with the plug in response to a detachment force that is, for example, less than the disengagement force and/or less than an extrication force sufficient to pull the plug away from the socket even when the locking mechanisms are engaged.

This example arrangement may allow an operator to insert the plug into the socket and then pull on the tab to determine if the plug is properly seated. For example, pulling on the tab when the plug is properly seated may exert a force on the tab that is sufficient to act as the detachment force and cause the tab to be removed from the handle, e.g., without providing enough force on the handle to deactivate or overcome the locking mechanisms that are holding the plug in the secured position relative to the socket. Put another way, a resistance against pulling the plug out of the socket when fully engaged may be greater than an amount of force that is sufficient to detach the flap. Thus, the absence of the tab may provide a visual indicator that the plug has been checked and verified as correctly seated. If, on the other hand, the plug is not fully secured in the socket, pulling on the tab may cause the plug to come out of the socket. This may be a result of the plug encountering insufficient resistance from the socket to cause the tab to detach from the handle, e.g., when the locking mechanisms are not yet engaged in the fully secured state. For example, a removal force sufficient to move the plug when not fully seated relative to the socket may be less than the detachment force sufficient to cause detachment of the tab from the handle. Thus, the presence of the tab may provide a visual indicator that the plug has not yet been checked. Accordingly, this arrangement may function as a physical confirmation system or mechanism for determining and/or confirming whether a particular cable has been properly seated relative to a socket.

Referring now to the figures, FIG. 1 illustrates a cabling product 100. The cabling product 100 may provide a suitable conduit for transfer of electrical power, data, and/or other signals between appliances (such as between servers and/or network hard drive components for a data center). The cabling product 100 shown in FIG. 1 includes a cable 102, a plug 104, a disengagement mechanism 110, an indicator 112, and one or more first locking features 116. The plug 104 is also shown in isolation in various states relative to a socket 118 in FIGS. 2-4, as described in greater detail below.

The cable 102 can include suitable wiring, optical fibers, and/or other conduits for transmitting electrical power, data, and/or other signals there through. For example, when the plug 104 is suitably engaged with the socket 118 of an appliance, the cable 102 may carry power, data, or other signals to or from that appliance. Although the cable 102 and associated components depicted and described herein may be particularly suited for optical transmissions, in some aspects, the cable 102 may be replaced with and/or include a conduit for other connection types, in addition or as alternatives, such as connections for acoustic communication, fluid communication, and/or electrical communication.

The plug 104 may be located at an end of the cable 102. The plug 104 can include a head 106 and a tail 108. For example, the head 106 can correspond to a portion of the plug 104 that is to be fully received within the socket 118, and the tail 108 can correspond to a portion that will extend outside the socket 118 when the plug 104 is fully engaged with the socket 118. The head 106 of the plug 104 can include a transceiver 114 or other appropriate structure for establishing sufficient connection between the plug 104 and the socket 118 for transferring data, power, etc. between the cable 102 and respective appliance. For example, the transceiver 114 may correspond to a small form-factor pluggable (SFP) transceiver, such as is commonly used for telecommunication and/or data communications applications. In further embodiments the transceiver 114 comprises an enhanced small form-factor pluggable (SFP+) transceiver or a compact small form-factor pluggable (CSFP) transceiver. In additional embodiments the plug 104 comprises an RJ45 connector or a similar connector.

The first locking features 116 may secure the plug 104 in the socket 118 in a seated configuration. The first locking features 116 can include any structure that prevents motion or removal of the plug 104 until released. For example, the first locking features 116 are shown as a pair of ramped, spring-loaded detents or prongs that can be retracted to permit removal of the plug 104 relative to the socket 118. However, other numbers of prongs may also be used. Additionally or alternatively, other structure may be used, including, but not limited to, any pin or flange that may be biased toward or away from particular states, for example due to resilience of the component or due to forces exerted by other associated components.

The disengagement mechanism 110 can be operable to disengage the first locking features 116. For example, in the embodiment shown in FIG. 1, the disengagement mechanism 110 includes a handle that can be pulled to retract prongs of the first locking features 116, e.g., so that that the plug 104 can be retracted away from a fully seated configuration in the socket 118. Construction of such disengagement mechanisms 110 is known, and accordingly internal configuration or other details relating to the interaction of the disengagement mechanism 110 (hereinafter, handle 110) and the first locking features 116 is not included herein. Additionally, although the handle 110 is shown as a solid member in the embodiment depicted in the figures, other options are possible in addition or as alternatives, including but not limited to loops or other structures that can be gripped by an operator and/or manipulated by a tool for movement relative to the plug 104.

The indicator 112 may be any structure that indicates a status of connection of the plug 104. For example, the indicator 112 may include a physical structure that may visually indicate a status based on the presence, absence, and/or position of the indicator 112. In the specific embodiment shown in FIG. 1, the indicator 112 is illustrated as a C-shaped tab of material detachably connected at two points to the handle 110. However, other structures are possible, such as flaps, flanges, or other members of any suitable size or shape, including, but not limited to, square, rectangular, oblong, hollow, solid, or other shapes. In some embodiments, the indicator 112 (hereinafter tab 112) may be sized to be gripped by a person or include an opening sized to permit receiving a finger or other implement (e.g., a screwdriver, hook, or other tool), e.g., to facilitate manipulating the tab 112 for application of a force to the tab 112.

The tab 112 may be detachable from the plug 104 or from an associated component, such as the handle 110. For example, the tab 112 can be configured to detach from the handle 110 in response to exertion of a detachment force on the tab 112. The tab 112 can be coupled with the handle 110 by any suitable connection 125. In various embodiments, the connection 125 facilitates detachment of the tab 112 in response to exertion of the detachment force on the tab 112. Suitable options for the connection 125 include, but are not limited to, scored sections, small severable sections, adhesive configured to provide a bonding force that is less than the detachment force, structure on the tab that is configured to at least one of mate or interlock with structure on the handle and to separate therefrom in response to exertion of the detachment force on the tab, hook and loop fasteners configured to separate from one another in response to exertion of the detachment force on the tab, and a connection structure having suitable dimensions and material strength for breaking in response to exertion of the detachment force on the tab.

Figure 2:
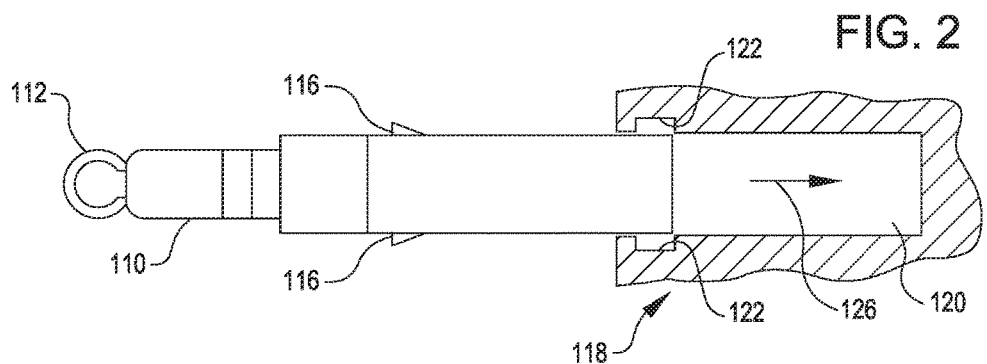
FIG. 2 is a cross sectional view of the cabling product of FIG. 1 in a position aligned with a socket within a cabling arrangement according certain embodiments.
Figure 3:
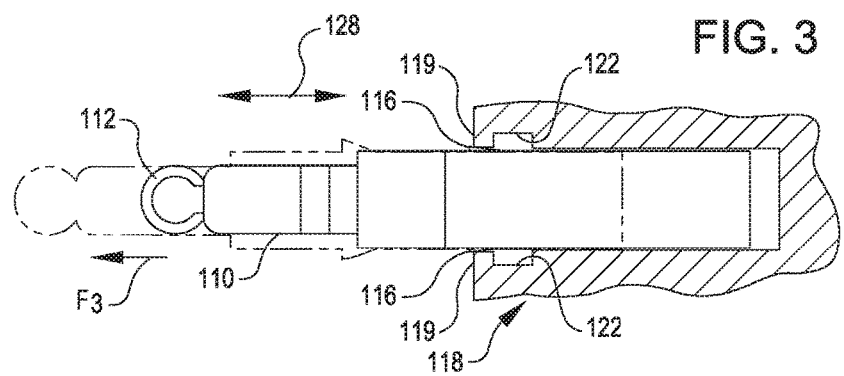
FIG. 3 is a cross sectional view of the cabling product of FIGS. 1 and 2 in a position partially within the socket according to certain embodiments.
Figure 4:
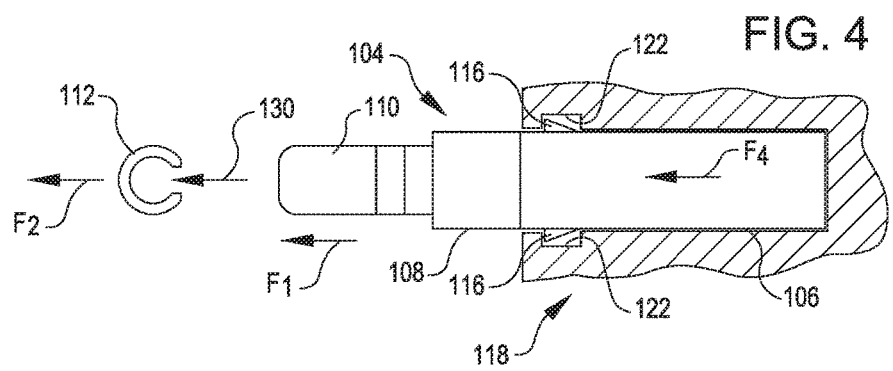
FIG. 4 is a cross sectional view of the cabling product of FIGS. 1-3 in a fully seated configuration relative to the socket according to certain embodiments.

FIGS. 2-4 illustrate example configurations relating to installing the plug 104 relative to the socket 118. The socket 118 may correspond to an appliance, for example, a server or network hard drive component for a data center. The socket 118 may correspond to any port, receptacle, or other suitable structure for facilitating transfer (e.g., of power or data) between the plug 104 and the appliance. In the embodiment shown in the drawings, the plug 104 is configured to be received within the socket 118. However, other arrangements are also possible, including, but not limited to arrangements in which the plug 104 is received about a structure of the socket 118.

With reference to FIG. 2, in an installation process according to certain embodiments, an operator may begin by inserting the head 106 of the plug 104 into a cavity 120 of the socket 118 (e.g., as represented by the arrow 126). In some aspects, the operator may temporarily leave the plug 104 in this preliminary state, for example, to verify that all paths have been properly routed before establishing connections.

Referring to FIG. 3, the operator may continue pushing the plug 104 into the socket 118 in an effort to establish connection between the plug 104 and socket 118. This movement (e.g., from the position shown in phantom lines to the position shown in solid lines) may cause the first locking features 116 to encounter surfaces 119 of the socket 118, which may move the first locking features 116 into a partially retracted condition and away from a fully extended condition (e.g., from the condition of the first locking features 116 shown in FIG. 2 to the condition shown in FIG. 3).

Referring to FIG. 4, continued motion of the plug 104 into the socket 118 can allow the first locking features 116 to move past the surfaces 119 and align with second locking features 122 (e.g., notches within the socket 118). Alignment with the second locking features 122 may permit the first locking features 116 to extend once more (e.g., in response to resilience of the first locking features 116 or springs or other biasing components acting on the first locking features). In this way, the first locking features 116 may engage the second locking features 122 and secure the plug 104 in a fully seated configuration relative to the socket 118. In some cases, an operator may hear a click corresponding to the first locking feature 116 engaging the second locking feature 122 as the plug 104 arrives in the fully seated configuration illustrated in FIG. 4. However, in some scenarios, the click may be inaudible (e.g., due to other noises nearby), leaving the operator uncertain whether the plug 104 has arrived to the fully seated configuration.

To release the plug 104 from fully seated configuration in the socket 118, an operator may exert a disengagement force $F_1$ on the handle 110, as best seen in FIG. 4. This may cause the first locking features 116 to retract so that the plug 104 can be withdrawn from the socket 118.

As noted above, the tab 112 may be utilized as an indicator determining and/or verifying whether the plug 104 has been properly seated in the seated configuration relative to the socket 118. Frequently, as an operator inserts the plug 104 into the socket 118, the operator may be uncertain as to whether the plug 104 has reached the fully seated configuration of FIG. 4 or whether the plug 104 is only partially and incompletely installed (e.g., as in FIG. 3). To determine which of these configurations the plug 104 is in, the operator may pull on the tab 112.

If the plug 104 is fully seated, as in FIG. 4, the operator's action of pulling on the tab 112 may exert a force that is sufficient to act as a detachment force $F_2$ on the tab 112 and cause the tab 112 to separate from the handle 110. This may cause the tab 112 to detach and move away from the handle 110 such as illustrated by the arrow 130 in FIG. 4. The tab 112 may be configured so that the detachment force $F_2$ is less than the disengagement force $F_1$. This may cause the tab 112 to detach before sufficient force is exerted on the handle 110 to disengage the first locking features 116 to cause the plug 104 to be removable.

In the alternative, if the plug 104 is not fully received in the socket 118, pulling on the tab 112 can exert a removal force $F_3$ on the plug 104. The removal force $F_3$ may be sufficient to pull the plug 104 out of the socket 118, e.g., when the first locking features 116 are not engaged or when the plug 104 is otherwise not fully secured in the socket 118. For example, the removal force $F_3$ may have a low magnitude resulting from minimal friction being present between the socket 118 and the first locking features 116 when the plug 104 is not fully seated. The tab 112 may be configured so that the detachment force $F_2$ is more than removal force $F_3$. This may cause the tab 112 to remain attached for pulling the plug 104 out of the socket 118 when an operator pulls on the tab 112 when the plug 104 is not fully seated.

In light of these alternative possibilities, an operator may use the tab 112 for determining or verifying the connection status of the plug 104. For example, during installation, the operator may move the plug 104 back and forth or in and out of the socket 118 using the tab 112 (e.g., as illustrated by arrow 128 in FIG. 3). After any time that the operator pushes the plug 104 in, the operator may subsequently try to pull the plug 104 using the tab 112. Each time this is done when the plug 104 is not fully engaged, the plug 104 will simply come out of the socket 118. On the other hand, when the plug 104 is finally engaged in the socket 118, pulling on the tab 112 (e.g., with the same force by the operator) can cause the tab 112 to detach instead of causing the plug 104 to exit or separate from the socket 118. The operator can thus know that the plug 104 is properly seated when the tab 112 has detached. Moreover, in an installation process including many connections, an operator may readily discern which plugs 104 have been verified (by looking to see which plugs 104 no longer have tabs 112) or which plugs 104 have not been verified (by looking to see which plugs still have tabs 112).

In some aspects, the handle 110 can also be removed and replaced when the tab 112 has already been removed. For example, this may provide a new opportunity for the tab 112 to indicate whether the plug 104 is properly seated. This may be useful when a plug 104 that was subject to an initial, verified installation (i.e., a plug 104 that no longer includes a tab 112) is to be disconnected and reused (e.g., for inspection or other maintenance, or when changes are desired for the connection arrangement of appliances). A removable handle 110 that can be replaced with another handle 110 having a new tab 112 may be useful in such case if an operator wishes to reconnect the plug 104 and have a new opportunity to determine and/or verify that the plug 104 is properly seated.

Although the illustrated embodiments primarily show the tab 112 coupled with the plug 104 at the handle 110, other arrangements are possible. For example, the tab 112 may be coupled directly to the plug 104, such as to the tail 108 of the plug shown in FIG. 1. In at least such cases, the detachment force $F_2$ sufficient to detach the tab 112 may be less than an extrication force $F_4$ that would be sufficient to at least partially extract the plug 104 from the socket 118 when the first locking features 116 and second locking features 122 are engaged. Such an arrangement may allow for a more robust version of the tab 112, for example, a tab 112 configured with a detachment force $F_2$ that has a magnitude between the disengagement force $F_1$ and the extrication force $F_4$, e.g., corresponding to a magnitude of force in between a sufficient amount for disengaging the locking features 116 and 122 and a sufficient amount for overcoming the locking features 116 and 122 when engaged.

Also, although some description above primarily describes cable routing systems in the context of servers and network components, embodiments herein may be applicable to any other form of appliance or structure, and may have particular applicability in those that use a plug secured in place relative to a socket. Additionally, in some instances less than all of the described elements can be included in a separate unit. As examples, in some aspects, a tab may be provided individually, within a separate handle subassembly, within a separate plug assembly, within a cable assembly, or within components pre-assembled or pre-connected for a datacenter.

Additionally, although the second locking features 122 are illustrated as notches of the socket 118 for receiving the prongs of the first locking features 116, any other suitable structure may be used for securing the plug 104 in the fully seated configuration. In some aspects, the physically interfering structures of the first locking features 116 and the second locking features 122 may be supplemented with or replaced by other locking mechanisms, including, but not limited to locking mechanisms that utilize magnetic components. Furthermore, although the first locking features 116 are illustrated as extending from the plug 104 and the second locking features 122 are shown recessed within the socket 118, other arrangements are possible. For example, in some embodiments, the relative position of the second locking features 122 and the first locking features 116 can be reversed so that recesses are provided on the plug 104 and extending protrusions are located in the socket 118 and movable into the notches on the plug 104 upon insertion of the plug 104 into the socket 118.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system comprising:
    an appliance comprising a computer server or a network hardware component, the appliance comprising a socket;
    a plug configured to be releasably received in the socket into a seated configuration;
    a locking mechanism comprising a first locking feature attached to the socket and a second locking feature attached to the plug, the first and second locking features configured to engage one another to secure the plug in the socket in the seated configuration;
    a handle coupled with the locking mechanism and operable, in response to a disengagement force exerted on the handle, to disengage the first and second locking features from one another so as to facilitate removal of the plug from the socket; and
    a tab detachably coupled with the handle, the tab configured to not detach from the handle in response to the plug being received in the socket, the tab configured to detach from the handle in response to a detachment force exerted on the tab, the detachment force being less than the disengagement force, whereby exertion of the detachment force on the tab while the locking features are engaged will cause the tab to detach from the handle so as to provide a visible indication that the locking features are engaged and securing the plug in the socket in the seated configuration.

2. The system of claim 1, wherein the plug is removable from the socket in response to a removal force when the first and second locking features are not engaged with one another; and
    wherein the detachment force is greater than the removal force, whereby exertion of the removal force on the tab while the tab is detachably coupled with the handle and while the locking features are disengaged or not yet engaged will cause the plug to at least partially move out of the socket so as to provide a physical indication that the locking features are disengaged or not yet engaged and that the plug is not in the seated configuration in the socket.

3. The system of claim 1, further comprising a cable coupled with the plug for transmission of power or data.

4. The system of claim 1, wherein the tab is detachably coupled with the handle by a connection that comprises:
    adhesive configured to provide a bonding force that is less than the detachment force;
    structure on the tab that is configured to mate or interlock with structure on the handle and to separate therefrom in response to exertion of the detachment force on the tab;
    hook and loop fasteners configured to separate from one another in response to exertion of the detachment force on the tab; or
    a connection structure having suitable dimensions and material strength for breaking in response to exertion of the detachment force on the tab.

5. A cabling product comprising:
    a cable;
    a plug coupled with an end of the cable;
    a locking feature configured to releasably secure the plug in a socket in a seated configuration; and
    an indicator detachably coupled with the plug, the indicator configured to detach from the plug in response to a detachment force exerted on the handle via the indicator, the detachment force being less than an extrication force that is sufficient to at least partially extract the plug from the socket when the locking feature is engaged.

6. The cabling product of claim 5, wherein the plug is removable from the socket in response to a removal force when the locking feature is not securing the plug in the socket in the seated configuration, the removal force being less than the detachment force.

7. The cabling product of claim 5, wherein the indicator is detachably coupled with the disengagement mechanism by a connection structure having suitable dimensions and material strength for breaking in response to exertion of the detachment force on the indicator.

8. The cabling product of claim 5, wherein the plug further comprises a disengagement mechanism coupled with the locking feature and operable, in response to a disengagement force exerted on the disengagement mechanism, to disengage the locking feature so as to facilitate removal of the plug from the socket.

9. The cabling product of claim 8, wherein the indicator is coupled with the disengagement mechanism, and wherein the detachment force is less than the disengagement force.

10. The cabling product of claim 9, wherein the locking feature comprises a prong or a notch for receiving a prong;
    wherein the disengagement mechanism comprises a handle; and
    wherein the indicator comprises a tab or flap coupled with the handle.

11. The cabling product of claim 5, wherein the plug comprises a transceiver.

12. The cabling product of claim 11, wherein the transceiver comprises an optical transceiver.

13. The cabling product of claim 12, wherein the transceiver comprises a small form-factor pluggable (SFP) transceiver.

14. A system comprising:
    a handle operable to disengage a locking mechanism from releasably securing a plug in a seated configuration in a socket, the handle extending backwardly and outwardly from a back face of the plug that is exposed when the plug is received in the socket; and
    a flap detachably coupled with the handle, the flap configured to detach from the handle in response to a detachment force exerted on the flap that is less than a disengagement force that is sufficient when exerted on the handle to disengage the locking mechanism.

15. The system of claim 14, wherein the flap is further configured for reattachment to the handle subsequent to detachment from the handle.

16. The system of claim 14, wherein the handle is configured for installation to replace another handle that has had a corresponding flap detached therefrom.

17. The system of claim 14, further comprising the plug.

18. The system of claim 17, wherein the plug comprises a transceiver configured for transmission of power or data via connection with the socket in the seated configuration.

19. The system of claim 17, further comprising a cable coupled with the plug.

20. The system of claim 19, further comprising an appliance, wherein the socket comprises a socket of the appliance.

* * * * *